United States Patent [19]

Furumiya

[11] Patent Number: 5,793,786
[45] Date of Patent: Aug. 11, 1998

[54] LASER DIODE DRIVING CIRCUIT

[75] Inventor: Shigeru Furumiya, Himeji, Japan

[73] Assignee: Matsushita Electric Industrial Co., Ltd., Osaka, Japan

[21] Appl. No.: 763,950

[22] Filed: Dec. 11, 1996

[51] Int. Cl.$^6$ .................................................. H01S 3/00
[52] U.S. Cl. ............................................................ 372/38
[58] Field of Search ............................................. 372/38

[56]  References Cited

U.S. PATENT DOCUMENTS

| | | | |
|---|---|---|---|
| 5,430,749 | 7/1995 | Horie | 372/38 |
| 5,513,197 | 4/1996 | Koishi . | |

FOREIGN PATENT DOCUMENTS

| | | |
|---|---|---|
| 495 576 | 7/1992 | European Pat. Off. . |
| 597 644 | 5/1994 | European Pat. Off. . |
| 63-285990 | 5/1987 | Japan . |
| 2-103984 | 11/1988 | Japan . |
| 5-315686 | 4/1992 | Japan . |
| 6-152027 | 5/1994 | Japan . |
| 7-95610 | 4/1995 | Japan . |

*Primary Examiner*—Brian Healy
*Assistant Examiner*—Robert E. Wise
*Attorney, Agent, or Firm*—Wenderoth, Lind & Ponack, L.L.P.

[57]  ABSTRACT

A driving circuit for a cathode-grounded type laser diode using NPN transistors is arranged to operate at high speed and to be less influenced by supply voltage fluctuations. A first NPN transistor is connected at a collector to a plus power source and at an emitter to the anode of the laser diode through a first resistor, and is supplied at a base with an externally given first control voltage. A second NPN transistor is connected at a collector to the anode of the laser diode and at an emitter to the ground through a second resistor. A logic buffer is provided for feeding a buffered output of an input data to the base of the second NPN transistor. The logic buffer is supplied as a supply voltage thereto with an externally given second control voltage. The first and second NPN transistors operate to control a current of the laser diode such that the laser diode is responsive to the input data for emitting a light switched between a first power determined by the first control voltage and a second power determined by the second control voltage.

12 Claims, 8 Drawing Sheets

LASER DIODE DRIVING CIRCUIT

BACKGROUND OF THE INVENTION

1. Field of the Invention

The present invention relates to a laser diode driving circuit used in an optical disk device or the like.

2. Description of the Prior Art

In an optical disk device, data are written on a disk in the form of a train of marks which are formed by emitting a laser beam regulated by an objective lens to a surface of the disk and modulating the intensity of the laser beam at high speed. As a laser light source, generally, a laser diode is used. Two types of laser diodes are available: one grounded at the cathode side and the other grounded at the anode side. An example of the conventional driving circuit for the laser diode grounded at the cathode side is shown in FIG. 5. In FIG. 5, a laser diode 107 is driven in parallel by a bias current source 103 which is composed of a PNP transistor 101 and a resistor 102, and a peak current source 106 which is composed of a PNP transistor 104 and a resistor 105, and the current from the peak current source 106 is switched by a PNP transistor 108. A peak light output is controlled by setting the base voltage of the transistor 104 of the peak current source 106, and the bias light output is controlled by setting the base voltage of the transistor 101 of the bias current source 103. The transistors 101, 104 and 108 used herein are generally PNP type transistors in relation to the polarity of the laser diode 107 and the positive power source.

To write data on an optical disk at high speed, rapid switching is required for the transistors. In the conventional laser diode driving circuit as mentioned above, PNP transistors are used. As compared with NPN transistors, PNP transistors are inferior in characteristics of large current and high speed operation. To obtain sufficient characteristics with the PNP transistors, a special manufacturing process is required, and hence components of the laser diode driving circuit become expensive. Besides, since the control voltage for setting the laser output is based on the power source voltage, fluctuation of the power source voltage causes changes of the control voltage, which in turn cause fluctuation of the laser output.

SUMMARY OF THE INVENTION

It is hence an object of the present invention to provide a laser diode driving circuit which is capable of operating at high speed by using only NPN type transistors in the driving circuit, and free from effects of fluctuations of the power source voltage.

To achieve the object, a laser diode driving circuit of the present invention comprises: a laser diode having an anode and a cathode, the cathode being connected to a ground; a first NPN transistor having a collector connected to a plus power source, an emitter connected to the anode of the laser diode through a first resistor, and a base being supplied with an externally given first control voltage; a second NPN transistor having a collector connected to the anode of said laser diode, an emitter connected to the ground through a second resistor, and a base; and a logic buffer for feeding a buffered output of an input data to the base of said second NPN transistor, said logic buffer being supplied as a supply voltage thereto with an externally given second control voltage.

The first NPN transistor feeds a current necessary for the laser diode to produce a light output of a first power. The second NPN transistor driven by high speed switching by the output data of the logic buffer shunts the current from the first NPN transistor to decrease the current of the laser diode to a current necessary for the laser diode to produce a light output of a second power. As a result, a light output switched between the first power and the second power in response to the input data is obtained. The first power of the light output is determined by the first control voltage, or the base voltage of the first NPN transistor, and the second power of the light output is determined by the second control voltage, or the power supply voltage to the logic buffer. Since the first and second control voltages are both reference voltages relative to the ground, or independent of the power source voltage, they are not influenced by fluctuations of the power source voltage.

A voltage dividing circuit may be inserted between the logic buffer and the base of the second NPN transistor to adjust the base voltage of the second NPN transistor such that the second NPN transistor operates at an optimum operating point. When a multiple-pit type logic buffer is used as the logic buffer, a light output modulated in more than two stages of power between the first power and the second power can be obtained.

DESCRIPTION OF THE PREFERRED EMBODIMENTS

Figure 1:
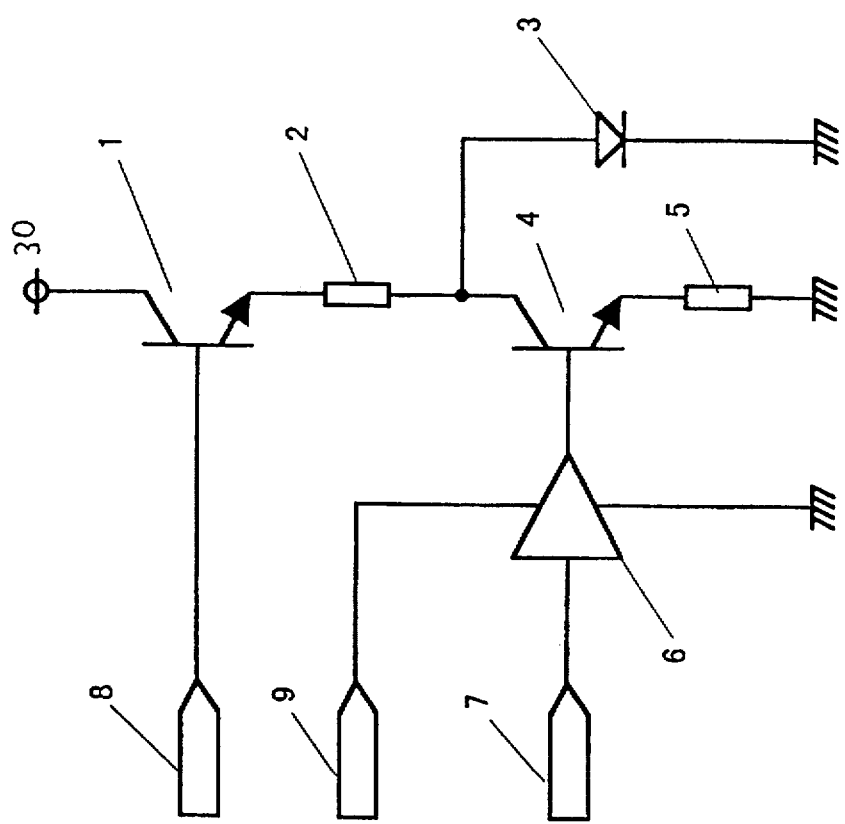
FIG. 1 is a circuit diagram of a laser diode driving circuit in a first embodiment of the present invention.

FIG. 1 is a circuit diagram of a laser diode driving circuit in a first embodiment of the present invention. Referring to FIG. 1, a laser diode 3 is of a plus driving type having a cathode connected to a ground. A first NPN transistor 1 is connected at a collector to a plus power source 30, at a base to a first power setting voltage input terminal 8, and at an emitter to an anode of the laser diode 3 through a first resistor 2. A second NPN transistor 4 is connected at a collector to the anode of the laser diode 3, at a base to an output terminal of a logic buffer 6, and at an emitter to the ground through a second resistor 5. The logic buffer 6 is connected at its input terminal to a data input terminal 7, and at its power supply terminal to a second power setting voltage input terminal 9.

Figure 2:
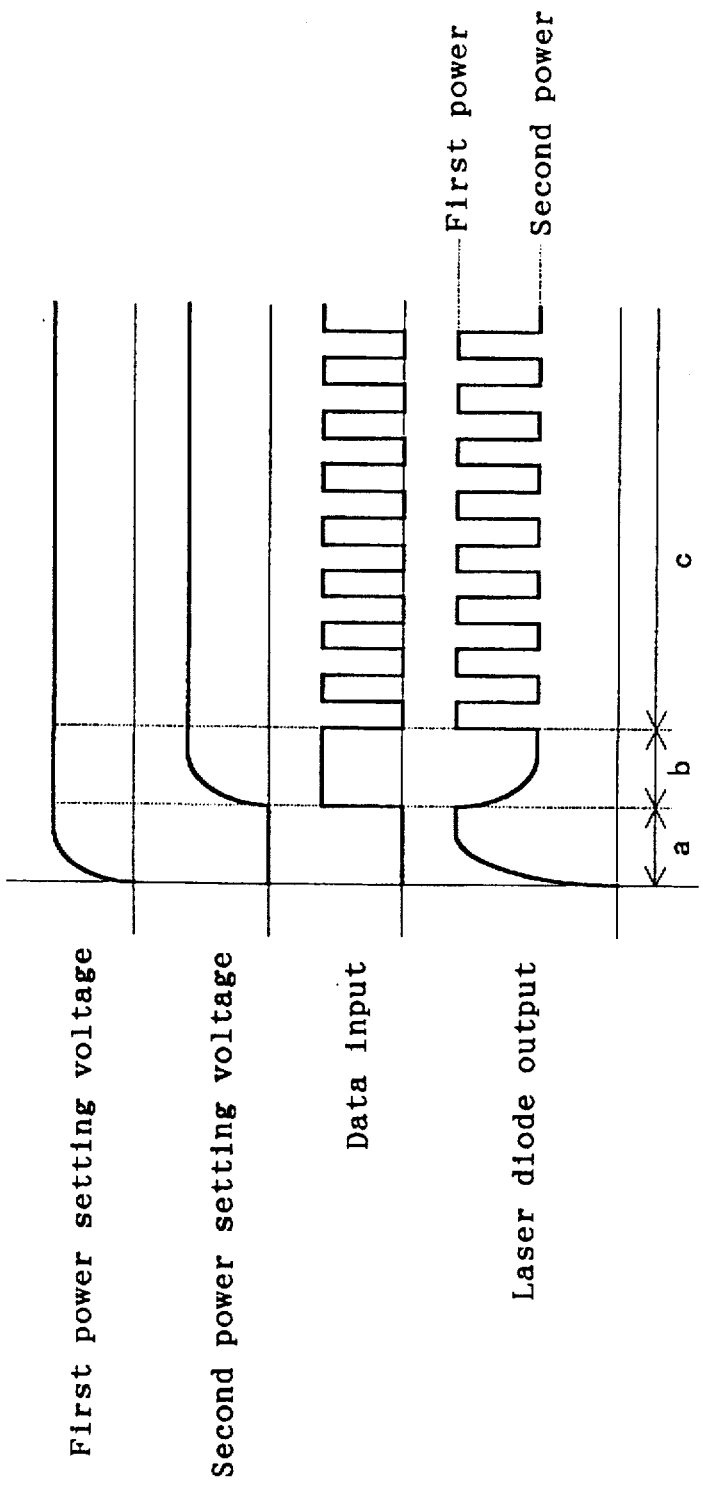
FIG. 2 is a signal waveform diagram showing an operation of the laser diode driving circuit in the first embodiment.

FIG. 2 is a signal waveform diagram showing an operation of the laser diode driving circuit in the first embodiment. Referring to FIG. 1 and FIG. 2, the operation of the first embodiment will be described below. First, in a cutoff state (inactive state) of the second NPN transistor 4, when the voltage of the first power setting voltage input terminal 8 is raised to a first power setting voltage (first control voltage)

as shown in a period "a" in FIG. 2, the first NPN transistor 1 becomes in an active state and supplies through the first resistor 2 to the laser diode 3 a current necessary for the laser diode 3 to produce a light output of a first power, so that the laser diode 3 emits a beam of light of the first power. Then, when the voltage at the data input terminal 7 is made to a high voltage, and the voltage of the second power setting voltage input terminal 9, which is the supply voltage to the logic buffer 6, is raised to a second power setting voltage (second control voltage) as shown in a period "b" in FIG. 2, the output voltage of the logic buffer 6, that is, the base voltage of the second NPN transistor 4 rises, and the second NPN transistor becomes in an active state. Since the second NPN transistor 4 grounded through the second resistor 5 forms a parallel circuit with the laser diode 3, it functions to decrease the current of the laser diode 3 so that the laser diode 3 emits a beam of light of the second power. When an input data applied to the data input terminal 7 is modulated to switch between a high voltage and a low voltage in this state as shown in a period "c" in FIG. 2, the power of the light emitted from the laser diode 3 is switched between two values of power, that is, the first power and the second power. As an example, the voltage of the plus power source 30 may be +12 V, the first power setting voltage may be a voltage selected in a range of 0 to +12 V, the second power setting voltage may be +5 V, and the input data may be a modulated pulse voltage signal whose high level is +5 V and whose low level is 0 V.

This embodiment, in spite of a very simple constitution, provides a high speed performance at low cost because the NPN transistors and the logic buffer are used. Moreover, since the control voltages (first and second power setting voltages) for determining the power of the laser diode output light are based on the grounding point, or independent of the plus power source voltage, the power of the output light does not change even if the power source voltage fluctuates somewhat.

Figure 3:
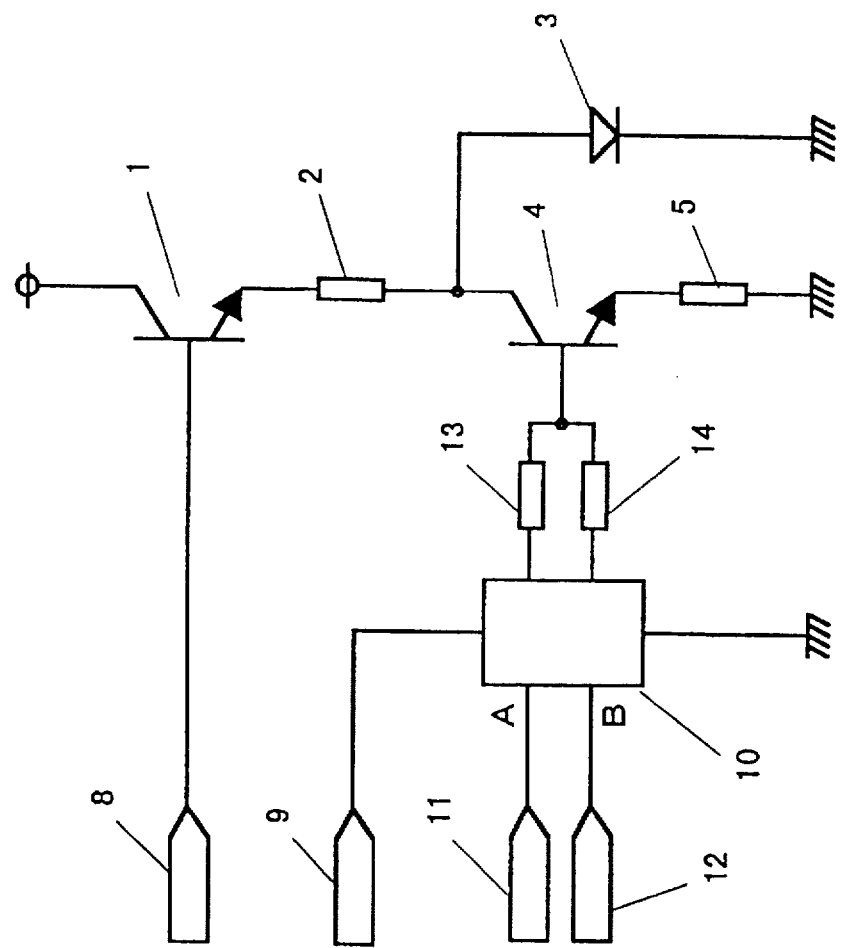
FIG. 3 is a circuit diagram of a laser diode driving circuit in a second embodiment of the present invention.

FIG. 3 is a circuit diagram of a laser diode driving circuit in a second embodiment of the present invention. In FIG. 3, as the elements identified with the same reference numerals as in the first embodiment function in the same way as in the first embodiment, duplicate explanation of them will be omitted. Referring to FIG. 3, a two-bit logic buffer 10 having two parallel input terminals and two parallel output terminals is used. The input terminals of the two-bit logic buffer 10 are connected to a data A input terminal 11 for inputting a data A and a data B input terminal 12 for inputting a data B, respectively. The output terminals of the two-bit logic buffer 10 are for outputting buffered outputs of the data A and B, respectively, and are connected to the base of the second NPN transistor 4 through a third resistor 13 and a fourth resistor 14, respectively. The third and fourth resistors constitute a voltage combining circuit which combines the two buffered output voltages from the two-bit logic buffer 10 so that a combination of the two buffered voltages is applied to the base of the second NPN transistor 4.

Figure 4:
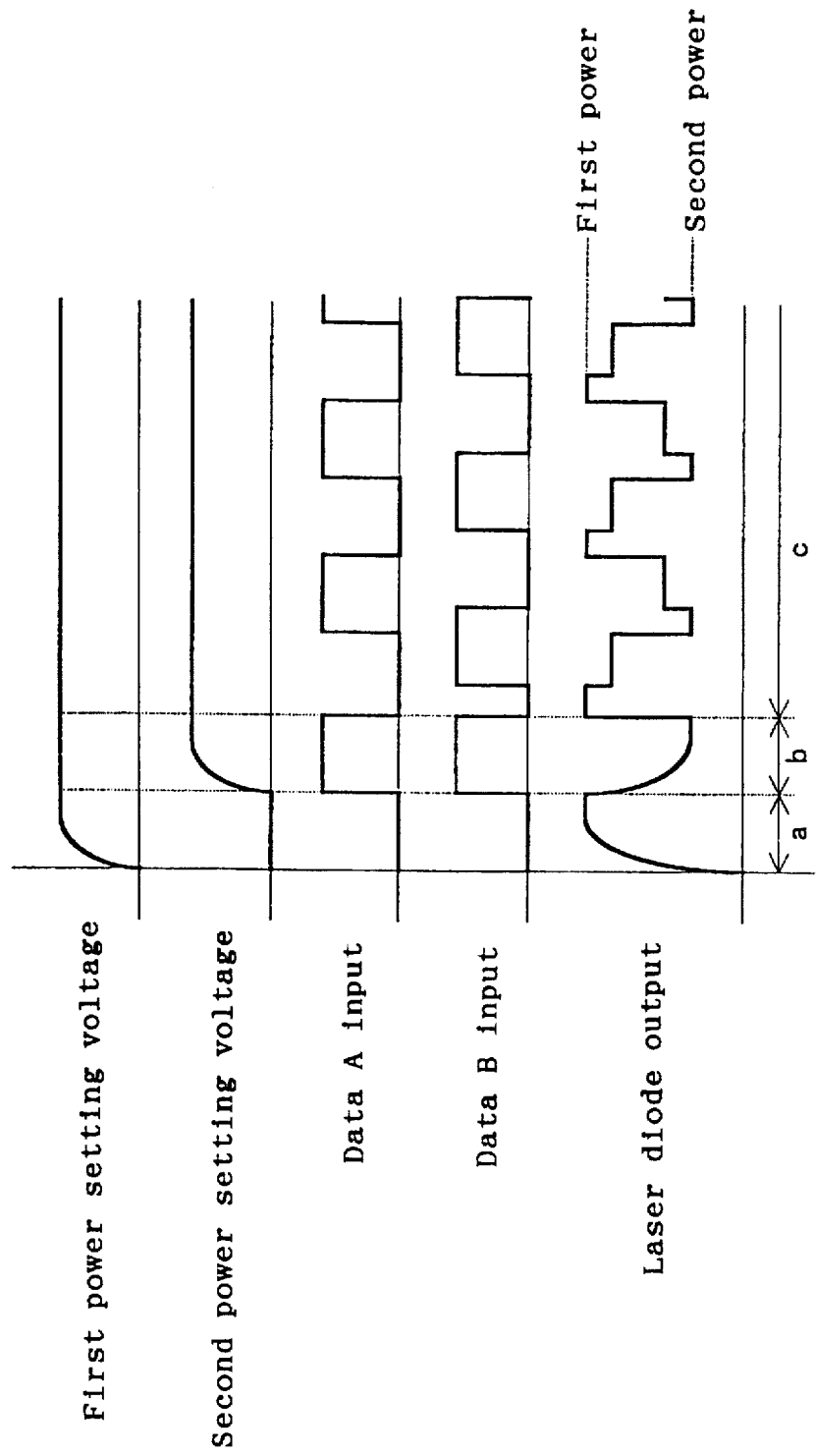
FIG. 4 is a signal waveform diagram showing an operation of the laser diode driving circuit in the second embodiment.
Figure 5:
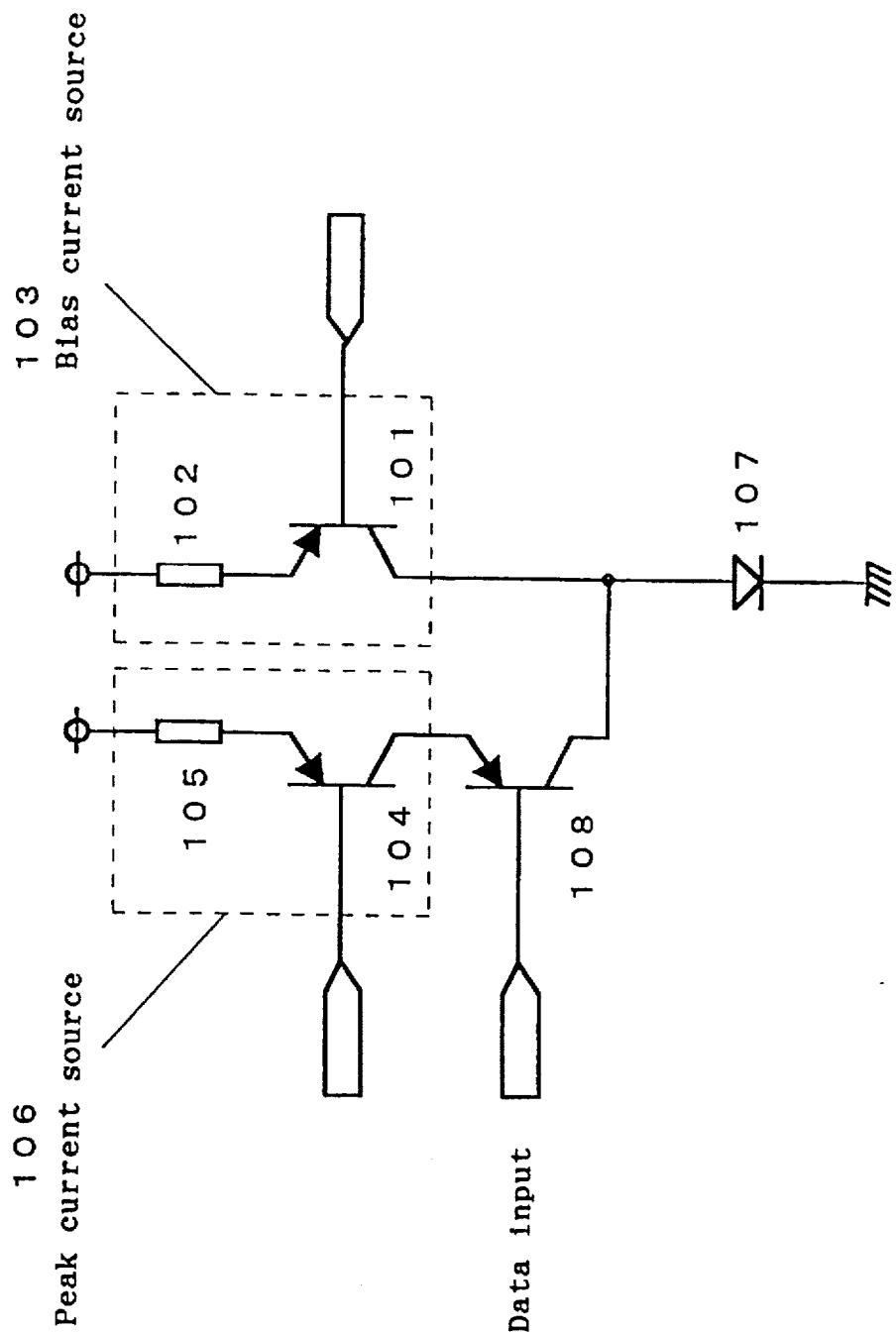
FIG. 5 shows a conventional laser diode driving circuit.

FIG. 4 is a signal waveform diagram showing an operation of the laser diode driving circuit of the second embodiment. The operation of the second embodiment will be described below with reference to FIG. 3 and FIG. 4. The explanation of the operation is also omitted in portions common to the first embodiment. First, in the same way as in the first embodiment, the laser diode 3 is caused to emit a light of the first power as shown in a period "a" in FIG. 4. Next, the data A input terminal 11 and the data B input terminal 12 are both set to a high voltage, and the supply voltage to the logic buffer 10 is raised to the second power setting voltage as shown in a period "b" in FIG. 4, so that the current of the laser diode 3 is decreased to emit a light of the second power. In this state, further, each of the data A at the data A input terminal 11 and the data B at the data B input terminal 12 are switched between a high level and a low level as shown in a period "c" in FIG. 4. Herein, when both the data A and the data B are high level, the voltage combined by the voltage combining circuit constituted by the third resistor 13 and the fourth resistor 14 is highest, and the second NPN transistor 4 passes most of the current supplied from the first NPN transistor 1, so that the current of the laser diode 3 decreases most, and the light emitted from the laser diode 3 becomes the second power. When both the data A and the data B are low level, to the contrary, the current of the laser diode 3 increases most to emit a light of the first power. When only either the data A or the data B is high level, the power of the emitted light becomes an intermediate value between the first power and the second power. When the data A and the data B are input such that the switching timings thereof are shifted from each other as shown in period "c" in FIG. 4, the laser output can be modulated in four stages of power from the first power to the second power.

The second embodiment may be modified such that data inputs are three or more bits, and the logic buffer is three-or-more-bit logic buffer to obtain a light output variable in more than four stages of power.

Figure 6:
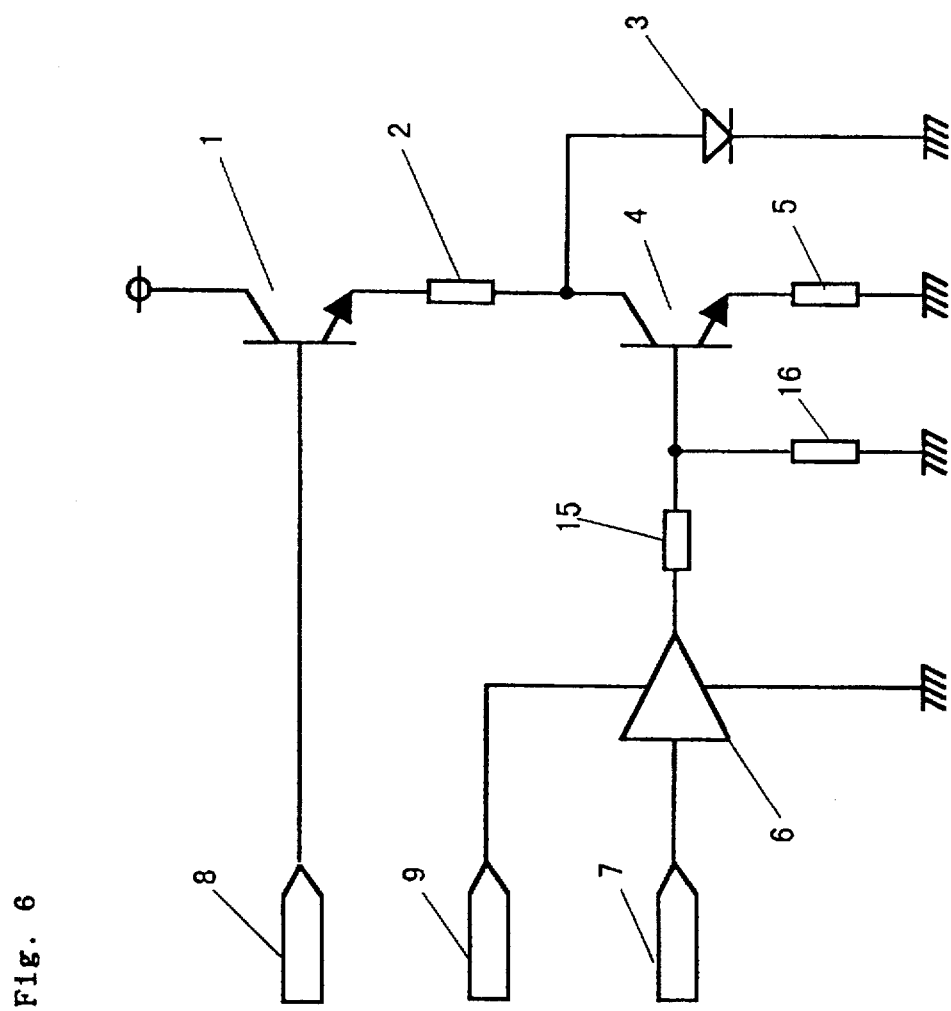
FIG. 6 is a circuit diagram of a laser diode driving circuit in a third embodiment of the present invention.

FIG. 6 is a circuit diagram of a laser diode driving circuit in a third embodiment of the present invention. In FIG. 6, as the elements identified with the same reference numerals as those in the first embodiment function in the same way as in the first embodiment, duplicate explanation of them will be omitted. Referring to FIG. 6, the base of the second NPN transistor 4 is connected to the input of the logic buffer 6 through a resistor 15, and to the ground through a resistor 16. The resistors 15 and 16 constitute a voltage dividing circuit for dividing the output voltage of the logic buffer 6. The voltage dividing circuit functions to adjust the base voltage of the second NPN transistor 4 so that the second NPN transistor 4 operates at an optimum operating point. The other parts of the third embodiment are exactly the same in constitution and operation as the first embodiment, and the signal waveform diagram is common to FIG. 2. Therefore, the light output of the laser diode 3 is switched between two values of power, that is, to be either the first power or the second power.

Figure 7:
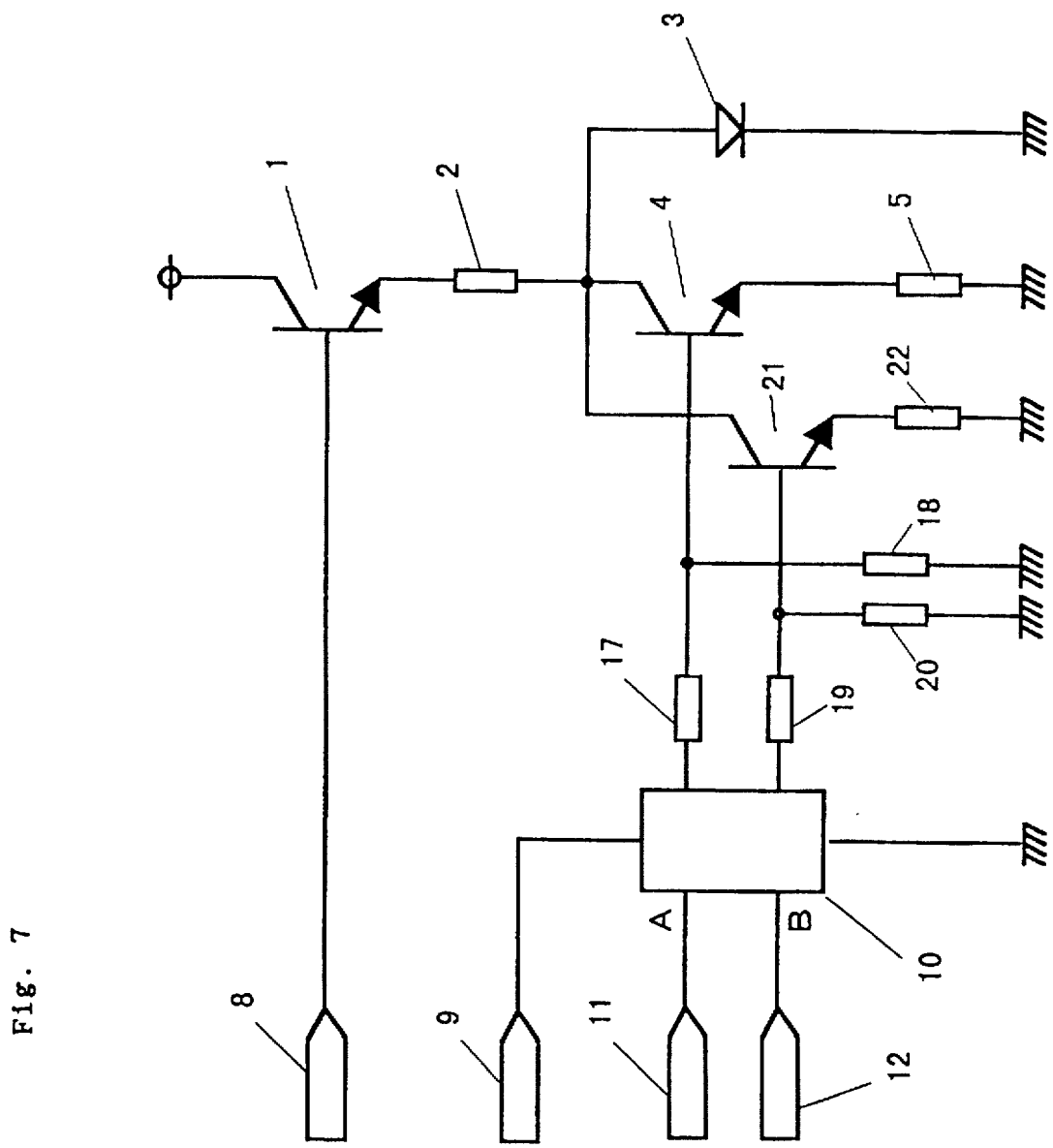
FIG. 7 is a circuit diagram of a laser diode driving circuit in a fourth embodiment of the present invention.

FIG. 7 is a circuit diagram of a laser diode driving circuit in a fourth embodiment of the present invention. In FIG. 7, as the elements identified with the same reference numerals as in the second embodiment function in the same way as in the second embodiment, explanation of them will be omitted. Referring to FIG. 7, in addition to the first and second NPN transistors 1 and 4, a third NPN transistor 21 is provided. The third NPN transistor 21 is connected at a collector to the anode of the laser diode 3, and at an emitter to the ground through a resistor 22. The base of the second NPN transistor 4 is connected to one of the two outputs of the two-bit logic buffer 10 through a resistor 17, and to the ground through a resistor 18. The base of the third NPN transistor 21 is connected to the other of the two outputs of the two-bit logic buffer 10 through a resistor 19, and to the ground through a resistor 20. The resistors 17 and 18 constitute a voltage dividing circuit to divide the output voltage from one of the two outputs of the two-bit logic buffer 10, and the resistors 19 and 20 constitute another voltage dividing circuit to divide the output voltage from the other of the two outputs of the two-bit logic buffer 10.

Figure 8:
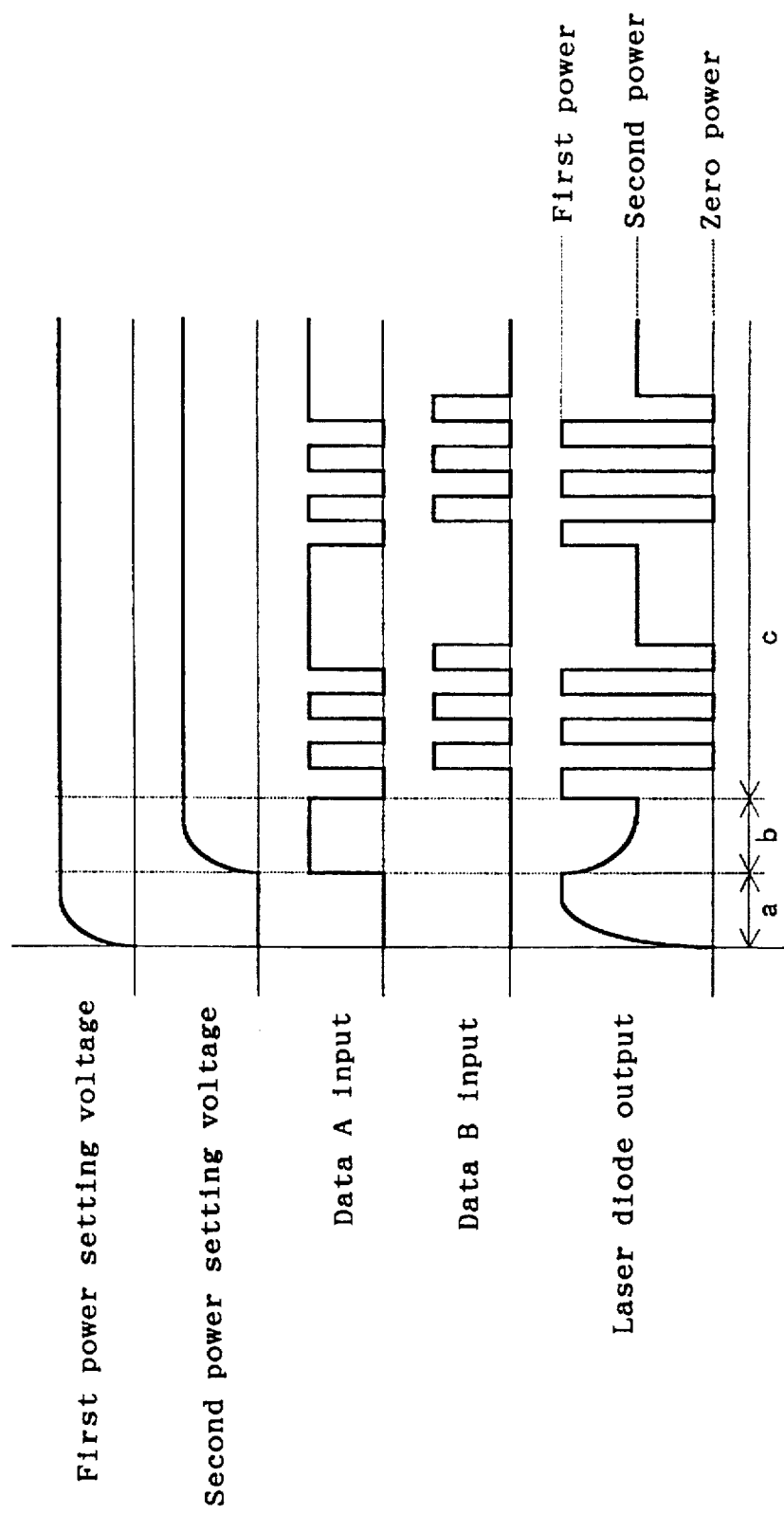
FIG. 8 is a signal waveform diagram showing an operation of the laser diode driving circuit in the fourth embodiment.

FIG. 8 is a signal waveform diagram showing an operation of the laser diode driving circuit of the fourth embodiment. The operation of the fourth embodiment will be described below with reference to FIG. 7 and FIG. 8. The explanation of the operation is omitted in portions common to the second embodiment. First, in the same way as in the second embodiment, the laser diode 3 is caused to emit a light of the first power as shown in a period "a" in FIG. 8. Next, the data A input terminal 11 is set high level and the data B input terminal 12 is set low level, and the supply voltage to the logic buffer 10 is raised to the second power setting voltage as shown in a period "b" in FIG. 8, so that the current of the laser diode 3 is decreased to emit a light of the second power. In this state, further, the data A and data B are switched in different switching patterns from each other as shown in a period "c" in FIG. 8. Herein, when both the data A and the data B are high level, majority of the current supplied from the first NPN transistor 1 flows to the second NPN transistor 4 and the third NPN transistor 21, and the current of the laser diode 3 becomes less than a threshold current necessary for the laser diode to emit light, so that the laser diode 3 stops emitting the light, that is, the light output power becomes zero power. When both the data A and the data B are low level, to the contrary, the current of the laser diode 3 increases most to emit the light of the first power. When only either the data A or the data B is low level, the light of the second power is emitted. When the data A and the data B are input in the switching pattern as shown in period "c" in FIG. 8, the laser output can be modulated in three stages of the first power, the second power, and the zero power.

Thus, as shown in four embodiments, the laser diode driving circuit of the present invention is effective to assure high speed in switching and stability against fluctuations of the power source voltage in spite of use of relatively inexpensive parts of NPN transistors as compared with PNP type transistors, although excellent in characteristics, and a simple structure using a general logic buffer. Therefore, when combined with an automatic laser power control circuit of feedback control, it is ideal as a laser driving circuit of optical disk device.

What is claimed is:

1. A laser diode driving circuit comprising:
   a laser diode having an anode and a cathode, the cathode being connected to a ground;
   a first NPN transistor having a collector connected to a plus power source, an emitter connected to the anode of the laser diode through a first resistor, and a base adapted to be supplied with an externally given first control voltage;
   a second NPN transistor having a collector connected to the anode of said laser diode, an emitter connected to the ground through a second resistor, and a base; and
   a logic buffer for feeding a buffered output of an input data to the base of said second NPN transistor, said logic buffer being adapted to be supplied as a supply voltage thereto with an externally given second control voltage.

2. A laser driving circuit according to claim 1, further comprising a voltage dividing circuit inserted between the logic buffer and the base of the second NPN transistor for dividing the buffered output from the logic buffer and feeding a divided buffered output to the base of the second NPN transistor so that the second NPN transistor operates at an optimum operating point.

3. A laser driving circuit according to claim 2, wherein said first and second NPN transistors operate to control a current of said laser diode such that said laser diode is responsive to the input data for emitting a light switched between a first power determined by the first control voltage and a second power determined by the second control voltage.

4. A laser driving circuit according to claim 1, wherein said first and second NPN transistors operate to control a current of said laser diode such that said laser diode is responsive to the input data for emitting a light switched between a first power determined by the first control voltage and a second power determined by the second control voltage.

5. A laser diode driving circuit comprising:
   a laser diode having an anode and a cathode, the cathode being connected to a ground;
   a first NPN transistor having a collector connected to a plus power source, an emitter connected to the anode of the laser diode through a first resistor, and a base adapted to be supplied with an externally given first control voltage;
   a second NPN transistor having a collector connected to the anode of said laser diode, an emitter connected to the ground through a second resistor, and a base; and
   a logic buffer for feeding buffered plural parallel outputs of plural parallel input data to the base of said second NPN transistor through plural parallel resistors, respectively, said logic buffer being adapted to be supplied as a supply voltage thereto with an externally given second control voltage.

6. A laser driving circuit according to claim 5, wherein said first and second NPN transistors operate to control a current of said laser diode such that said laser diode is responsive to the plural parallel input data for emitting a light switched in multiple powers between a first power determined by the first control voltage and a light of a second power determined by the second control voltage.

7. A laser diode driving circuit comprising:
   a laser diode having an anode and a cathode, the cathode being connected to a ground;
   a first NPN transistor having a collector connected to a plus power source, an emitter connected to the anode of the laser diode through a first resistor, and a base adapted to be supplied with an externally given first control voltage;
   a second NPN transistor having a collector connected to the anode of said laser diode, an emitter connected to the ground through a second resistor, and a base;
   a third NPN transistor having a collector connected to the anode of said laser diode, an emitter connected to the ground through a third resistor, and a base; and
   a logic buffer for feeding a buffered output of a first input data through a first voltage dividing circuit to the base of said second NPN transistor, and feeding a buffered output of a second input data through a second voltage dividing circuit to the base of said third NPN transistor, said logic buffer being adapted to be supplied as a supply voltage thereto with an externally given second control voltage.

8. A laser driving circuit according to claim 7, wherein said first, second and third NPN transistors operate to control a current of said laser diode such that said laser diode emits a light switched in response to the first input data between a first power determined by the first control voltage and a second power determined by the second control voltage, and switched in response to the second input data between the second power and zero power.

9. A laser diode driving circuit comprising:
   a laser diode having an anode and a cathode, the cathode being connected to a ground;

a first control terminal adapted to receive an externally given first control voltage;

a second control terminal adapted to receive an externally given second control voltage;

a data input terminal adapted to receive an input data;

a first NPN transistor having a collector connected to a plus power source, an emitter connected to the anode of the laser diode through a first resistor, and a base connected to the first control terminal;

a second NPN transistor having a collector connected to the anode of said laser diode, an emitter connected to the ground through a second resistor, and a base; and a logic buffer connected between the data input terminal and the base of the second NPN transistor for feeding a buffered output of the input data to the base of said second NPN transistor, said logic buffer being connected at a power supply terminal thereof to the second control terminal, wherein said first and second NPN transistors operate to control a current of said laser diode such that said laser diode emits a light switched in response to the input data between a first power determined by the first control voltage and a second power determined by the second control voltage.

10. A laser diode driving circuit comprising:

a laser diode having an anode and a cathode, the cathode being connected to a ground;

a first control terminal adapted to receive an externally given first control voltage;

a second control terminal adapted to receive an externally given second control voltage;

a plurality of data input terminals adapted to receive a plurality of parallel input data;

a first NPN transistor having a collector connected to a plus power source, an emitter connected to the anode of the laser diode through a first resistor, and a base connected to the first control terminal;

a second NPN transistor having a collector connected to the anode of said laser diode, an emitter connected to the ground through a second resistor, and a base;

a logic buffer connected to the plurality of data input terminals for producing buffered outputs of the plurality of parallel input data, said logic buffer being connected at a power supply terminal thereof to the second control terminal; and a voltage combining circuit connected between said logic buffer and the base of the second NPN transistor to combine the buffered outputs of the plurality of parallel input data from said logic buffer and feed an obtained combination to the second NPN transistor, wherein said first and second NPN transistors operate to control a current of said laser diode such that said laser diode emits a light switched in response to the plurality of parallel input data in multiple powers between a first power determined by the first control voltage and a second power determined by the second control voltage.

11. A laser diode driving circuit comprising:

a laser diode having an anode and a cathode, the cathode being connected to a ground;

a first control terminal adapted to receive an externally given first control voltage;

a second control terminal adapted to receive an externally given second control voltage;

a data input terminal adapted to receive an input data;

a first NPN transistor having a collector connected to a plus power source, an emitter connected to the anode of the laser diode through a first resistor, and a base connected to the first control terminal;

a second NPN transistor having a collector connected to the anode of said laser diode, an emitter connected to the ground through a second resistor, and a base;

a logic buffer connected to the data input terminal for producing a buffered output of the input data, said logic buffer being connected at a power supply terminal thereof to the second control terminal; and a voltage dividing circuit connected between said logic buffer and the base of the second NPN transistor to divide the buffered output of the input data from said logic buffer and feed an obtained division to the base of the second NPN transistor, wherein said first and second NPN transistors operate to control a current of said laser diode such that said laser diode emits a light switched in response to the input data between a first power determined by the first control voltage and a second power determined by the second control voltage.

12. A laser diode driving circuit comprising:

a laser diode having an anode and a cathode, the cathode being connected to a ground;

a first control terminal adapted to receive an externally given first control voltage;

a second control terminal adapted to receive an externally given second control voltage;

first and second data input terminals adapted to receive parallel first and second input data;

a first NPN transistor having a collector connected to a plus power source, an emitter connected to the anode of the laser diode through a first resistor, and a base connected to the first control terminal;

a second NPN transistor having a collector connected to the anode of said laser diode, an emitter connected to the ground through a second resistor, and a base;

a third NPN transistor having a collector connected to the anode of said laser diode, an emitter connected to the ground through a third resistor, and a base;

a logic buffer connected to the first and second data input terminals for producing buffered outputs of the first and second input data, said logic buffer being connected at a power supply terminal thereof to the second control terminal;

a first voltage dividing circuit connected between said logic buffer and the base of the second NPN transistor to divide the buffered output of the first input data from said logic buffer and feed an obtained division to the base of the second NPN transistor; and a second voltage dividing circuit connected between said logic buffer and the base of the third NPN transistor to divide the buffered output of the second input data from said logic buffer and feed an obtained division to the base of the third NPN transistor, wherein said first and second NPN transistors operate to control a current of said laser diode such that said laser diode emits a light switched in response to the first input data between a first power determined by the first control voltage and a second power determined by the second control voltage, and switched in response to the second input data between the second power and zero power.

* * * * *